(12) United States Patent
Farooq et al.

(10) Patent No.: US 9,219,023 B2
(45) Date of Patent: Dec. 22, 2015

(54) 3D CHIP STACK HAVING ENCAPSULATED CHIP-IN-CHIP

(75) Inventors: Mukta G. Farooq, Hopewell Junction, NY (US); Kangguo Cheng, Albany, NY (US); Louis Lu-Chen Hsu, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 913 days.

(21) Appl. No.: 12/689,455

(22) Filed: Jan. 19, 2010

(65) Prior Publication Data

US 2011/0175215 A1  Jul. 21, 2011

(51) Int. Cl.
| | |
|---|---|
| H01L 23/48 | (2006.01) |
| H01L 25/065 | (2006.01) |
| H01L 25/00 | (2006.01) |
| H01L 29/06 | (2006.01) |
| H01L 23/00 | (2006.01) |

(52) U.S. Cl.
CPC .......... *H01L 23/481* (2013.01); *H01L 25/0657* (2013.01); *H01L 25/50* (2013.01); *H01L 29/0657* (2013.01); *H01L 24/05* (2013.01); *H01L 24/16* (2013.01); *H01L 2224/0401* (2013.01); *H01L 2224/0557* (2013.01); *H01L 2224/13025* (2013.01); *H01L 2225/06513* (2013.01); *H01L 2225/06541* (2013.01); *H01L 2924/0002* (2013.01); *H01L 2924/00014* (2013.01); *H01L 2924/01078* (2013.01); *H01L 2924/01079* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/1305* (2013.01); *H01L 2924/13091* (2013.01); *H01L 2924/19041* (2013.01); *H01L 2924/19042* (2013.01); *H01L 2924/19043* (2013.01)

(58) Field of Classification Search
CPC .......................... H01L 23/481; H01L 25/0657
USPC .......... 257/686, 723, 724; 361/760–764, 767, 361/768, 776, 783; 438/106
See application file for complete search history.

(56) References Cited

U.S. PATENT DOCUMENTS

| | | | |
|---|---|---|---|
| 4,764,804 A | 8/1988 | Sahara et al. | |
| 6,524,888 B2 | 2/2003 | Cokely et al. | |
| 6,838,758 B1 * | 1/2005 | Montiel | 257/678 |

(Continued)

OTHER PUBLICATIONS

Cahill, D.G. et al., "Thermal conductivity of sputtered and evaporated SiO2 and TiO2 optical coatings" Applied Physics Letters (Jul. 18, 1994) pp. 309-311, vol. 65, No. 3.

(Continued)

*Primary Examiner* — Mark Tornow
(74) *Attorney, Agent, or Firm* — Scully, Scott, Murphy & Presser P.C.

(57) ABSTRACT

A method of forming a three-dimensional (3D) chip is provided in which a second chip is present embedded within a first chip. In one embodiment, the method includes forming a first chip including first electrical devices and forming a recess extending from a surface of the first chip. A second chip is formed having second electrical devices. The second chip is then encapsulated within the recess of the first chip. Interconnects are then formed through the first chip into electrical communication with at least one of the second devices on the second chip. A three-dimensional (3D) chip is also provided in which a second chip is embedded within a first chip.

17 Claims, 5 Drawing Sheets

(56) References Cited

U.S. PATENT DOCUMENTS

| | | | |
|---|---|---|---|
| 7,335,972 B2 | 2/2008 | Chanchani | |
| 7,438,882 B2 | 10/2008 | Goodwin et al. | |
| 7,453,150 B1 | 11/2008 | McDonald | |
| 7,489,025 B2 | 2/2009 | Chen et al. | |
| 7,534,722 B2 | 5/2009 | Trezza | |
| 7,829,991 B2* | 11/2010 | Moden et al. | 257/686 |
| 2004/0094804 A1 | 5/2004 | Amos et al. | |
| 2006/0113598 A1* | 6/2006 | Chen et al. | 257/347 |
| 2008/0079121 A1 | 4/2008 | Han | |
| 2008/0157330 A1* | 7/2008 | Kroehnert et al. | 257/686 |
| 2008/0197893 A1 | 8/2008 | Wyman et al. | |
| 2008/0253085 A1 | 10/2008 | Soffer | |
| 2009/0014858 A1* | 1/2009 | Boon et al. | 257/686 |
| 2009/0020855 A1* | 1/2009 | Pyeon | 257/621 |
| 2009/0267171 A1* | 10/2009 | Yean et al. | 257/434 |
| 2009/0302435 A1* | 12/2009 | Pagaila et al. | 257/659 |
| 2009/0309212 A1* | 12/2009 | Shim et al. | 257/700 |
| 2010/0101849 A1* | 4/2010 | Sunohara et al. | 174/260 |
| 2010/0109138 A1* | 5/2010 | Cho | 257/686 |
| 2011/0101512 A1* | 5/2011 | Choi et al. | 257/686 |

OTHER PUBLICATIONS

Office Action dated Jan. 23, 2015 received in U.S. Appl. No. 13/789,891.

* cited by examiner

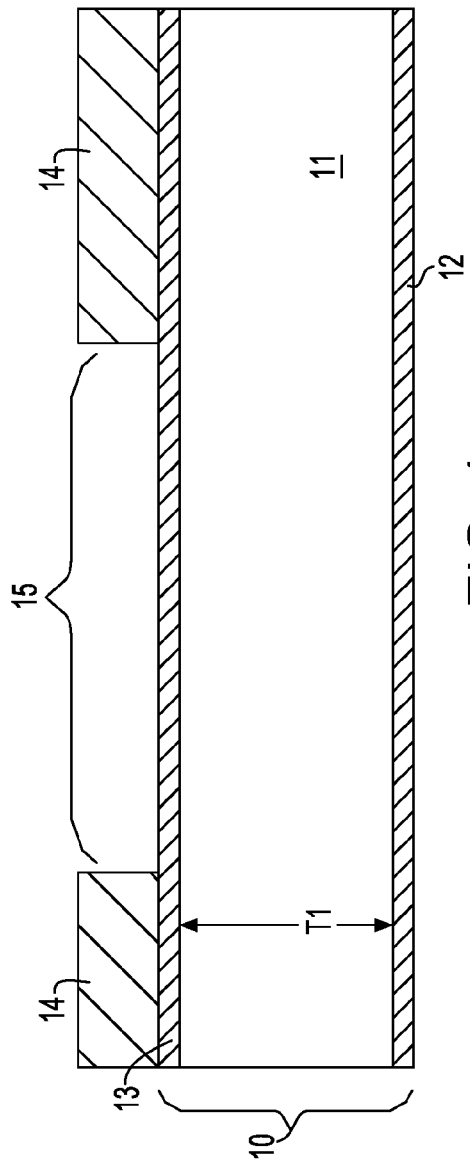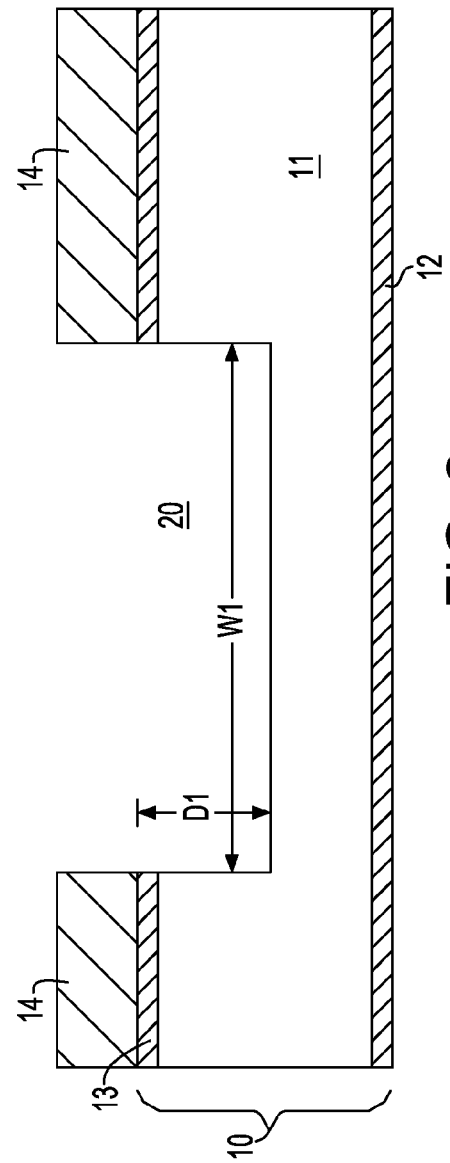

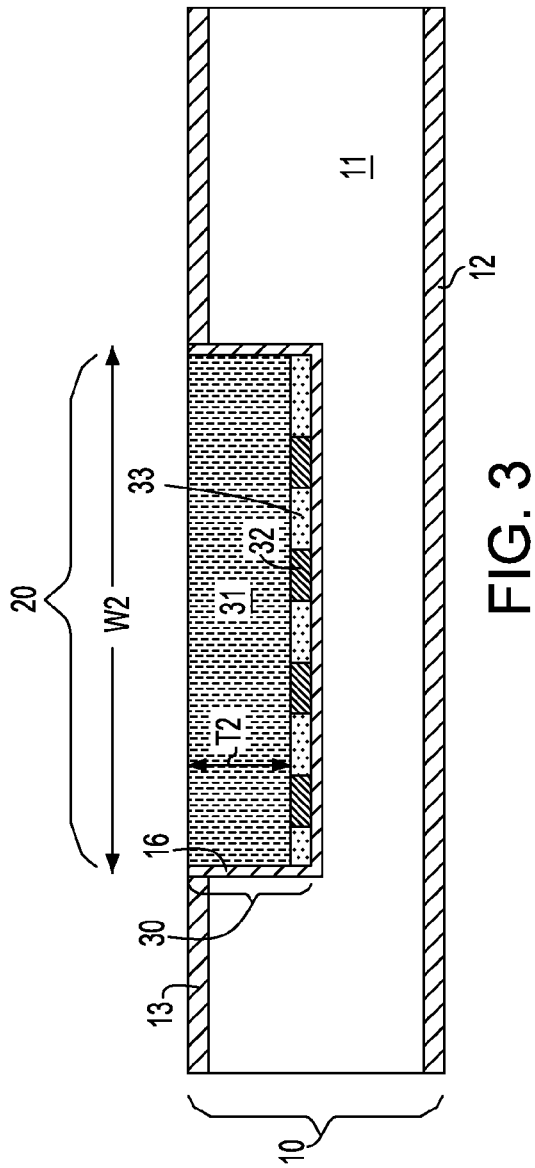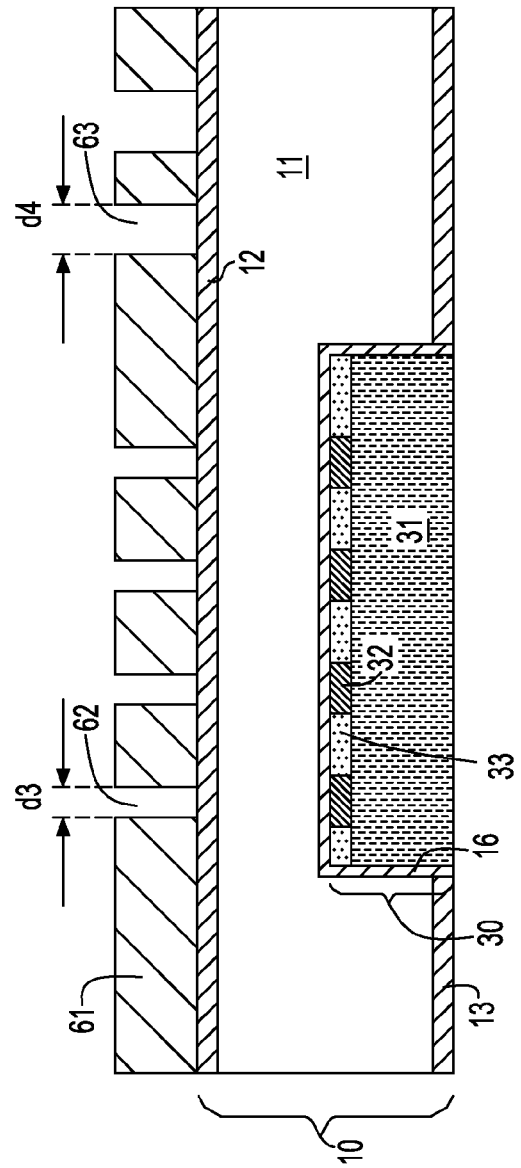

3D CHIP STACK HAVING ENCAPSULATED CHIP-IN-CHIP

BACKGROUND

The present disclosure relates generally to three-dimensional (3D) micro-electronic structures.

Multi-story chip technology is in demand for use in small electronic devices including cell phones, digital cameras, personal digital assistant (PDA), global positioning systems (GPS), and laptop computers, etc. Multi-story chip technology structures are formed by one chip being vertically bonded to another chip. Such multi-story chip assembly which is also known as a 3D-chip stack, allows a plurality of flash memory chips or a CPU to be stacked with at least one memory chip and other types of chips. In some examples, the wires that have been typically used to connect stacked chips have been replaced with metal pins that are formed by drilling through each die's silicon and filling the holes with a metal. These in-silicon pins are called "through-silicon vias" (TSV).

SUMMARY

The present disclosure, in some embodiments, provides a three-dimensional (3D) chip integration scheme having a chip-in-chip (CIC) structure. In one embodiment, a structure is provided that includes a first chip including first electrical devices present therein and having a recess present therein, and a second chip including second electrical devices present therein, in which the second chip is positioned within the recess of the first chip. In one embodiment, interconnects are formed to at least one of the second electrical devices of the second chip that extend through the first chip into contact with the second chip.

In another aspect, a method of forming a three-dimensional (3D) chip is provided. In one embodiment, the method includes forming a recess in a first chip, and positioning a second chip within the recess of the first chip. The first chip includes first electrical devices, and the second chip includes second electrical devices. Interconnects may be formed through the first chip into electrical communication with at least one of the second electrical devices on the second chip.

DESCRIPTION OF SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 is a side cross-sectional view depicting one embodiment of forming a first etch mask on a second protective layer of a first chip, in which the first chip includes a first protective layer, a first body and the second protective layer, in accordance with one embodiment of the present invention.

FIG. 2 is a side cross-sectional view of forming a recess in the first chip through the second protective layer and into the first body, in which the first chip includes first electrical devices, in accordance with one embodiment of the present invention.

FIG. 3 is a side cross-sectional view of positioning a second chip within the recess of the first chip, wherein the second chip includes a second body and contact pads present in an interlevel dielectric layer, in accordance with one embodiment of the present invention.

FIG. 4 is a side cross-sectional view of forming a second etch mask on the second protective layer of the first chip, in accordance with one embodiment of the present invention.

DETAILED DESCRIPTION

Figure 5:
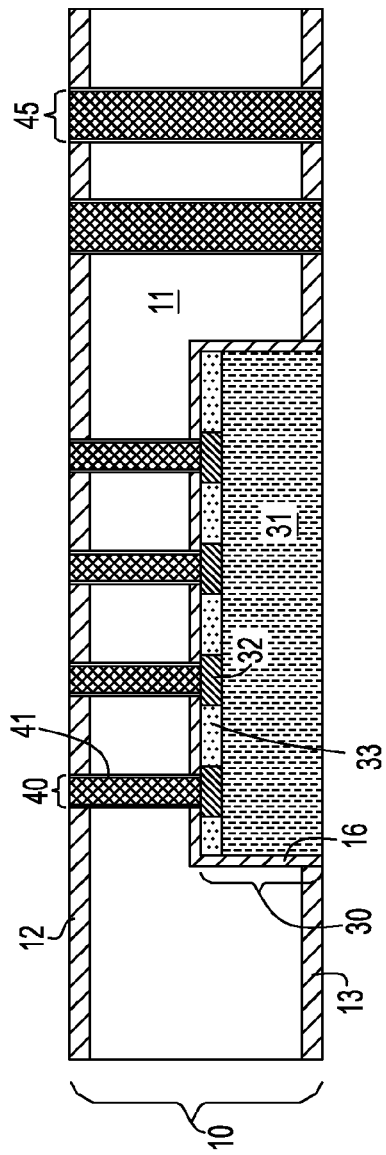
FIG. 5 is a side cross-sectional view of etching the second dielectric layer and the first body selective to the contact pads of the second chip to provide a via, and forming a dielectric liner on the sidewalls of the via, in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to methods of forming three-dimensional (3D) chips, in which a second chip, e.g., child chip, is present encapsulated within a first chip, e.g., mother chip, to provide a chip-in-chip integration structure. Specifically, a recess is formed in the first chip having a geometry that is configured for housing the second chip. In one embodiment, the exterior face of the second chip is substantially coplanar with a backside surface of the first chip to provide a substantially co-planar bonding surface. A via containing a conductive material, such as a through silicon via, is formed through the first chip reaching the second chip. In some embodiments, the planar bonding surface that is provided by the chip-in-chip integration structure produced by encapsulating the second chip within the first chip facilitates the production of multi-layered electronic devices. When describing the inventive method and structures, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. A dominant carrier concentration in an extrinsic semiconductor determines the conductivity type of the semiconductor.

"Electrical communication" as used through the present disclosure means that a first structure and a second structure are connected by a material having a room temperature conductivity of greater than $10^{-8}(\Omega\text{-m})^{-1}$.

"Embedded" means that at least a first portion of a second chip is present within a first chip.

"Encapsulated" means that a second chip is embedded within a first chip, in which the second chip has at least one exterior face that is coplanar with at least one exterior face of the first chip, or the second chip is embedded within the first chip so the entirety of the second chip is within the first chip.

The term "direct contact" means that a first element, such as a first structure, and a second element, such as a second structure, are connected without any intermediary conducting, insulating or semiconductor layers at the interface of the two elements.

"Planarization" is a material removal process that employs at least mechanical forces, such as frictional media, to produce a planar surface.

"Chemical Mechanical Planarization" is a material removal process using both chemical reactions and mechanical forces to remove material and planarize a surface.

As used herein, the term "selective" in reference to a material removal process denotes that the rate of material removal for a first material is greater than the rate of removal for at least another material of the structure to which the material removal process is being applied.

As used herein, an "anisotropic etch process" denotes a material removal process in which the etch rate in the direction normal to the surface to be etched is greater than in the direction parallel to the surface to be etched.

The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element.

FIG. 1 depicts one embodiment of a first chip 10, e.g., a mother chip, that has been fabricated with device and circuits in accordance with front end of the line (FEOL) manufacturing processes, and includes interconnects that have been fabricating in accordance with back end of the line (BEOL) manufacturing processes. The first chip 10 typically includes a first body 11, a first protective layer 12 present on a front side of the first body 11, and a second protective layer 13 present on a back side of the first body 11. The first body 11 typically includes first electrical devices present therein, such as semiconductor devices. For example, the first electrical devices that are present in the first body 11 may include transistors such as field effect transistors, e.g., MOSFETS and CMOS devices, and the first body 11 may include bipolar junction transistors. In another embodiment, the first electrical devices of the first body 11 may include memory devices, such as flash memory, dynamic random access memory (DRAM), and embedded dynamic random access memory. It is noted that the first electrical devices present within the first body 11 may not be limited to the above noted electrical devices, as the first body 11 may include any combination of the aforementioned devices, as well as any transistor, inductor, capacitors, resistors, fuse and/or diode used in memory or logic devices.

Typically, the first body 11 includes at least one substrate of a semiconductor material, which may provide the active region of at least one of the aforementioned devices that are present within the first body 11. The substrate may include any number of active and/or passive devices (or regions) located within the substrate or on a surface thereof. For example, the substrate may comprise any semiconductor material including, but not limited to Si, Ge, SiGe, SiC, SiGeC, InAs, GaAs, InP and other III/V compound semiconductors. The substrate may be undoped, or doped. In one example, the doping of a Si-containing substrate may be light (having a dopant concentration of less than 1E17 atoms/cm$^3$) or heavy (having a dopant concentration of about 1E17 atoms/cm$^3$ or greater). The substrate can have any crystallographic orientation such as (100), (110) or (111). Hybrid substrates having at least two planar surfaces of different crystallographic orientation are also contemplated.

For illustrative purposes, in the embodiments in which the first body 11 includes field effect transistors (FETs), one example of a process sequence employed during front end of the line (FEOL) processing to provide field effect transistors includes the following: field oxidation of the semiconductor substrate; patterning of the field oxide to define an active region and depositing a gate dielectric on an exposed surface of the semiconductor substrate; forming a gate conductor on the gate dielectric, patterning the gate conductor and gate dielectric to provide a gate structure; and ion implantation of the exposed portion of the semiconductor substrate adjacent to the gate structure with n-type or p-type dopants to provide source and drain regions. It is noted that above sequence is not intended to limit the invention, as other process steps may be employed during front end of the line (FEOL) processing. For example, multiple device regions may be independently process by utilizing photolithography processes. The multiple device regions may be isolated from each other by isolation regions produced by local oxidation of silicon or trench isolation formation.

For illustrative purposes, in the embodiments in which the first body 11 includes field effect transistors (FETs), one example of a process sequence employed during back end of the line (BEOL) processing to provide an interconnect structure to the field effect transistors includes the following: blanket depositing a layer of dielectric material atop the semiconductor substrate; planarizing the blanket layer of dielectric material; patterning and etched the dielectric layer to form via holes to the various source regions and drain regions and gate conductor structures; forming conductive studs within the vias; and forming an interconnect line in electrical communication with the conductive studs. It is noted that above sequence is not intended to limit the invention, as other process steps may be employed during back end of the line (BEOL) processing.

In one embodiment, the first body 11 is provided from a wafer that has been sectioned. For example, the first body 11 may have been diced. Wafer dicing is a process by which individual silicon chips or integrated circuits on a silicon wafer are separated following the processing of the wafer. The dicing process can be accomplished by scribing and breaking, by mechanical sawing, or by laser cutting. In one embodiment, the thickness $T_1$ of the first body 11 ranges from 50 µm to 150 µm. In another embodiment, the thickness $T_1$ of the first body 11 ranges from 70 µm to 120 µm. In yet another embodiment, the thickness $T_1$ of the first body 11 ranges from 80 µm to 100 µm.

The first protective layer 12 and the second protective layer 13 are typically composed of a dielectric material. The first protective layer 12 and the second protective layer 13 may be composed of a same or different dielectric material. In one embodiment, the first and second protective layer 12, 13 may be composed of an oxide, nitride or oxynitride material. In one example, the first and second protective layer 12, 13 are composed of silicon oxide. In another example, the first and second protective layer 12, 13 are composed of silicon nitride. The thickness of the first and second protective layers 12, 13 may range from 1 µm to 15 µm, typically ranging from 5 µm to 10 µm. The first and second protective layer 12, 13 may be formed on the first body 11 of the first chip 10 using a deposition method including, but not limited to spinning from solution, spraying from solution, chemical vapor deposition (CVD), plasma enhanced CVD (PECVD), sputter deposition, reactive sputter deposition, ion-beam deposition, and evaporation.

Referring to FIGS. 1 and 2, the first chip 10 may be patterned and etched to provide a recess 20 having dimensions that are suitable to house a second chip, so that the second chip may be embedded and encapsulated within the first chip 10. In one embodiment, the recess 20 in the first chip 10 may be formed using deposition, photolithography and etching. For example, and as illustrated in FIG. 1 a first etch mask 14 (also referred to as a block mask) is formed having an opening 15 that exposes the portion of the first chip 10 in which the second chip will subsequently be embedded. This portion of the first chip 10 is where the recess 20 will be formed.

The first etch mask 14 may comprise conventional soft and/or hardmask materials and can be formed using deposition, photolithography and etching. In one embodiment, the first etch mask 14 comprises a photoresist. A first etch mask 14 composed of photoresist can be produced by applying a photoresist layer to the second protective layer 13, exposing the photoresist layer to a pattern of radiation, and developing the pattern into the photoresist layer utilizing a resist developer to form the opening 15.

Alternatively, the first etch mask 14 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to silsequioxanes, siloxanes, and boron phosphate silicate glass (BPSG). A first etch mask 14 comprising a hardmask material may be formed by blanket depositing a layer of hardmask material, providing a patterned photoresist atop the layer of hardmask material, and etching the layer of hardmask material to provide the opening 15.

FIG. 2 depicts one embodiment of etching the backside of the first chip 10 to provide the recess 20. In one example, a timed etch is utilized to control the depth D1 of the recess 20 so that it is 10% shallower than the thickness of the second chip that will be housed within the recess 20. In one embodiment, the etch process is a two stage selective etch. For example, a first etch chemistry may remove the exposed portion of the second protective layer 13 selective to the first etch mask 14 and the first body 11 of the first chip 10. Once the portion of the first body 11 underlying the opening 15 in the first etch mask 14 is exposed, a second etch chemistry may etch the exposed portion of the first body 11 selective to the first etch mask 14. In one embodiment, the first etch mask 14 may be removed during the first etch stage. In this example, the remaining portion of the second protective layer 13 functions as an etch mask as the recess 20 is being etched into the first body 11 of the first chip 10. In the embodiments in which the first etch mask 14 remains on the second protective layer 13 after the recess 20 has been formed in the first chip 10, the first etch mask 14 may be removed using an etch process. When the first etch mask 14 is composed of a photoresist material, the first etch mask 14 may be removed by oxygen ashing or stripping.

In one embodiment, the etch process that provides the recess 20 includes an anisotropic etch process. The anisotropic etch may include reactive-ion etching (RIE). Reactive Ion Etching (RIE) is a form of plasma etching in which during etching, the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the disclosure include ion beam etching, plasma etching or laser ablation.

The dimensions of the recess 20 are selected so that the second chip may be housed within the recess so that it is embedded within the first chip 10, and in some embodiments provides a planar backside surface. In one embodiment, the recess 20 has a depth D1 ranging from 25 µm to 75 µm as measured from the exterior surface of the second protective layer 13. In another embodiment, the recess 20 has a depth D1 ranging from 35 µm to 45 µm as measured from the exterior surface of the second protective layer 13. The width W1 of the recess 20 typically ranges from 50 µm to 20,000 µm. In one embodiment, the width W1 of the recess 20 ranges from 500 µm to 10,000 µm. In another embodiment, the width W1 of the recess 20 ranges from 2,000 µm to 5,000 µm.

FIG. 3 depicts positioning a second chip 30 within the recess 20 of the first chip 10. The second chip 30 includes a second body 31 and pad contacts 32 that are present in an interlevel dielectric layer 33. In one embodiment, and prior to introducing the second chip 30 to the recess 20 of the first chip 10, a conformal dielectric layer 16 is formed on the sidewall and base surfaces of the recess 20. The term "conformal" denotes a layer having a thickness that does not deviate from greater than or less than 20% of an average value for the thickness of the layer. In one embodiment, the conformal dielectric layer 16 may be formed using deposition techniques, such as chemical vapor deposition (CVD), atomic layer CVD (ALCVD), pulsed CVD, plasma of photo assisted CVD, sputtering, and chemical solution deposition. In another embodiment, the conformal dielectric layer 16 is formed by thermal growing process, which may include oxidation, oxynitridation, nitridation, and/or plasma or radical treatment. Suitable examples of oxides that can be employed for the conformal dielectric layer 16 include, but are not limited to $SiO_2$, $Al_2O_3$, $ZrO_2$, $HfO_2$, $Ta_2O_3$, $TiO_2$, perovskite-type oxides and combinations and multi-layers thereof. In one embodiment, the conformal dielectric layer 16 has a thickness ranging from 50 nm to 550 nm. In another embodiment, the conformal dielectric layer 16 has a thickness ranging from 100 nm to 500 nm. In yet another embodiment, the conformal dielectric layer 16 has a thickness ranging from 150 nm to 450 nm.

FIG. 3 depicts one embodiment of a second chip 30, e.g., a child chip, that has been fabricated with devices and circuits in accordance with front end of the line (FEOL) manufacturing processes, and includes interconnect structures that have been fabricated in accordance with back end of the line (BEOL) manufacturing processes. The second chip 30 typically includes a second body 31 including second electrical devices present therein, such as semiconductor devices. For example, the second electrical devices that are present in the second body 31 may include transistors such as field effect transistors, e.g., MOSFETS and CMOS devices, and the second body 31 may include bipolar junction transistors. In another embodiment, the second electrical devices of the second body 31 may include memory devices, such as flash memory, dynamic random access memory (DRAM), and embedded dynamic random access memory. It is noted that the second electrical devices present within the second body 31 may not be limited to the above noted electrical devices, as the second body 31 may include any combination of the aforementioned devices, as well as any transistor, inductor, capacitors, resistors, fuse and/or diode used in memory or logic devices.

Typically, the second body 31 includes at least one substrate of a semiconductor material, which may provide the active region of at least one of the aforementioned devices that are present within the second body 31. The substrate may include any number of active and/or passive devices (or regions) located within the substrate, or on a surface thereof. For example, the substrate may comprise any semiconductor material including, but not limited to Si, Ge, SiGe, SiC, SiGeC, InAs, GaAs, InP and other III/V compound semiconductors. The substrate may be undoped, or doped. In one example, the doping of a Si-containing substrate may be light (having a dopant concentration of less than $1E17$ atoms/cm$^3$) or heavy (having a dopant concentration of about $1E17$ atoms/cm$^3$ or greater). The substrate can have any crystallographic orientation such as (100), (110) or (111). Hybrid substrates having at least two planar surfaces of different crystallographic orientation are also contemplated. The second body 31 may further include dielectric layers to provide electrical device passivation and interconnect structures, such as studs and interconnect lines, to provide electrical communication to the second electrical devices present therein.

In one embodiment, an interlevel dielectric layer 33 having contact pads 32 present therein is formed on at least one face of the second body 31 of the second chip 30. The interlevel dielectric layer 32 may be blanket deposited atop the entire surface of the second body 31 and planarized. The interlevel dielectric layer 33 may be selected from the group consisting of silicon-containing materials such as $SiO_2$, $Si_3N_4$, $SiO_xN_y$, SiC, SiCO, SiCOH, and SiCH compounds, the aforementioned silicon-containing materials with some or all of the Si replaced by Ge, carbon-doped oxides, inorganic oxides, inorganic polymers, hybrid polymers, organic polymers, such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the interlevel dielectric 32 include: any of the aforementioned materials in porous form, or in a form that changes during processing to or from being porous and/or permeable to being non-porous and/or non-permeable.

The interlevel dielectric layer 33 may be formed by various methods well known to those skilled in the art, including, but not limited to spinning from solution, spraying from solution, chemical vapor deposition (CVD), plasma enhanced CVD (PECVD), sputter deposition, reactive sputter deposition, ion-beam deposition, and evaporation. The interlevel dielectric layer 33 typically has a thickness that ranges from 20 nm to 1000 nm. In another embodiment, the interlevel dielectric layer 33 has a thickness that ranges from 100 nm to 300 nm.

In one embodiment, the interlevel dielectric layer 33 may be patterned and etched to form holes to the various interconnect structures to the second electrical devices present in the second body 31. In one example, the interlevel dielectric layer 33 may be patterned and etched using deposition, photolithography and deposition methods.

Following the formation of the openings within the interlevel dielectric layer 33, contact pads 32 can be formed by depositing a conductive metal into the openings using deposition methods, such as chemical vapor deposition, sputtering or plating. The conductive metal may include, but is not limited to tungsten, copper, aluminum, silver, gold, and alloys thereof. The contact pads 32 are typically in electrical communication with the series of interconnected structures, e.g., interconnect line, that provide electrical communication to the second electrical devices that are present in the second body 31.

Similar to the first chip 10, the second chip 30 may be provided from a wafer that has been sectioned. In one embodiment, the second chip 30 has been diced. The dicing process can be accomplished by scribing and breaking, by mechanical sawing, e.g., or by laser cutting. In one embodiment, the thickness $T_2$ of the second body 31 ranges from 20 μm to 60 μm. In another embodiment, the thickness $T_2$ of the second body 31 ranges from 30 μm to 50 μm. In yet another embodiment, the thickness $T_2$ of the second body 31 ranges from 35 μm to 45 μm. The width $W_2$ of the second body 31 typically ranges from 50 μm to 20000 μm. In another embodiment, the width $W_2$ of the second body 31 ranges from 500 μm to 5000 μm. It is noted that the above dimensions are provided for illustrative purposes only, as other dimensions have been contemplated and are within the scope of the present disclosure, so long as the dimensions of the second body 31 are suitable for being housed in the recess 20 of the first chip 10.

Still referring to FIG. 3, in one embodiment, the second chip 30, e.g., child chip, may be flip-chip bonded to the first chip 10, e.g., parent chip, in the recess 20 of the first chip 10. More specifically, the exposed surface of the contact pads 32 are brought into direct contact with the conformal dielectric layer 16 that is present on at least the base of the recess 20 in the first chip 10. The interconnect between the first chip 10 and the second chip 30 is provided by a flip-bond. Flip-bonding is a method for interconnecting semiconductor devices, such as IC chips, to external circuitry with solder bumps that have been deposited onto the chip pads, e.g., contact pads 32 of the second chip. In one embodiment, the solder bumps are composed of at least one of tin, lead, silver, copper and gold.

In one embodiment, flip-chip bonding between the first chip 10 and the second chip 30 is produced by thermal bonding. For example, during thermal bonding the temperature ranges from 85° C. to 380° C. In another embodiment, the temperature ranges from 100° C. to 250° C. During the application of temperature and the optional application of pressure the solder bumps experience reflow and create a bond between the contact pads 32 of the second chip 30 and the conformal dielectric layer 16 of the first chip 10.

In one embodiment, the backside surface of the second chip 30 is coplanar with the remaining portion of the backside surface of the first chip 10, which provides a planar surface for bonding to additional chip layers. In some examples, a planarization process applied to the backside surface of the second chip 30 is continued until contacting the second protective layer 13 that is present on the backside surface of the first chip 10. The planarization process may remove excess material from the backside surface of the second chip 30 to ensure that the backside surface of the second chip 30 is coplanar with the backside surface of the first chip 10. In one example, the planarization process is provided by chemical mechanical planarization (CMP). "Chemical Mechanical Planarization" is a material removal process using both chemical reactions and mechanical forces to remove material and planarize a surface.

Figure 6:
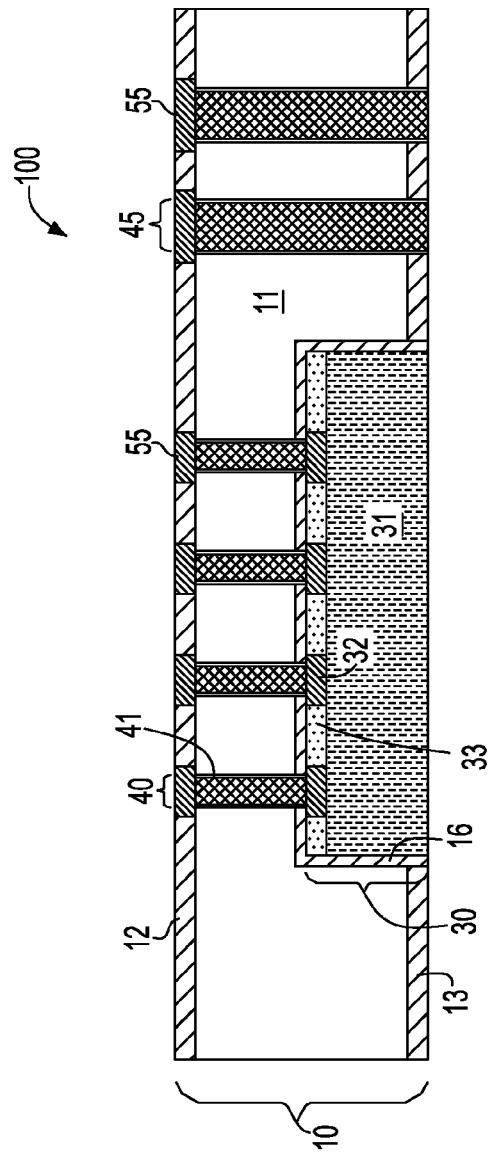
FIG. 6 is a side cross-sectional view of filling the via with a conductive material to provide interconnects through the first chip into electrical communication with at least one of the second electrical devices on the second chip, in accordance with one embodiment of the present invention.

FIGS. 4-6 depict one embodiment for forming electrical connections to the first chip 10 and the second chip 30. In one embodiment, forming the electrical connections includes forming interconnects 50 through the first chip 10 into electrical communication with the at least one of the second electrical devices on the second chip 30. In one example, forming the interconnects 50 includes forming a second etch mask 61 on the first protective layer 12 of the first chip 10, and etching the exposed portions of the first protective layer 12, the first body 11, and the conformal dielectric layer 16 selective to the contact pads 31 of the second chip 30 to provide a via 40. A dielectric liner 41 may then be formed on the sidewalls of the via 40, wherein the via 40 and is filled with a conductive material 42 to provide the interconnect 50. In one example, the interconnect 50 may be referred to as Through Semiconductor (e.g., silicon) Via (TSV).

FIG. 4 depicts one embodiment of forming a second etch mask 61 on the first protective layer 12 of the first chip 10. In one embodiment, the second etch mask 61 may comprise conventional soft and/or hardmask materials and can be formed using deposition, photolithography and etching. In one embodiment, the second etch mask 61 comprises a photoresist. In another embodiment, the second etch mask 61 can be a hardmask material. A second etch mask 61 composed of photoresist can be produced by applying a photoresist layer to the first protective layer 12, exposing the photoresist layer to a pattern of radiation, and developing the pattern into the photoresist layer utilizing a resist developer to form at least two opening. In one embodiment, the second etch mask 61 includes a first opening 62 to provide via to at least one second electrical device that is present in the second chip, and a second opening 63 to provide at least one via to at least one first electrical device or to another chip, i.e., mother chip.

In one embodiment, the second opening 63 of the second etch mask 61 provides the pattern of a via that penetrates the entire thickness of the first chip 10, whereas the first opening 61 of the second etch mask 61 provides the pattern of a via that penetrates only a portion of the thickness of the first chip 10. In one embodiment, the second opening 63 of the second etch mask 61 has a greater width than the first opening 61 of the second etch mask 61. In one embodiment, the first opening 62 has a width $d_3$ ranging from 50 nm to 800,000 nm, and the second opening 63 has a width $d_4$ ranging from 100 nm to 100,000 nm. In another embodiment, the first opening 62 has a width $d_3$ ranging from 1,000 nm to 10,000 nm, and the second opening 63 has a width $d_4$ ranging from 2,000 nm to 5,000 nm.

FIG. 5 depicts etching the first protective layer 12 and the first body 11 selective to the contact pads 32 of the second chip 30 to provide vias 40, 45, and forming a dielectric liner 41 on the sidewalls of the vias 40, 45. In one embodiment, the vias 40, 45 are formed using an etch process, such as anisotropic etch process, e.g., reactive ion etch (RIE). In one example, the etch process is selective to the contact pads 31 of the second chip 30. For example, the selective etch process may be a two stage etch. The first stage of the etch process may include an etch chemistry that removes the exposed portions of the first protective layer 12, selective to the first body 11, and the second etch mask 61. In a second stage of the etch process, the etch chemistry removes the exposed surface of the first body 11 selective to the second etch mask 61 and the contact pads 32 of the second chip 30. In some embodiments, the second etch mask 61 may be removed by the etch chemistry of the first stage of the etching process. In this embodiment, the remaining portion of the first protective layer 12 provides the etch mask for etching the first body 11 selective to the contact pads 32.

The via 40 (hereafter referred to as contact pad via 40) that is provided by the first opening 62 of the second etch mask 61 exposes the contact pads 32 of the second chip 30. The via 45 (hereafter referred to as through first chip via 45) that is provided by the second opening 63 of the second etch mask 61 may be utilized to contact the first electrical devices of the first chip 10 or may provide for electrical connectivity to devices of an adjacent chip in a stacked chip arrangement.

FIG. 5 further depicts one embodiment of forming a dielectric liner 41 on the sidewalls of the contact pad via 40 and the through first chip via 45. The dielectric liner 41 may be composed of any dielectric material including, but not limited to oxide, nitrides and oxynitrides. The dielectric liner 41 may be formed using conformal deposition methods, such as plasma enhanced chemical vapor deposition, or thermal growth, such as thermal oxidation. In the embodiments in which the dielectric liner 41 is deposited by conformal deposition, the dielectric liner 41 that is deposited at the base of the via, such as the contact pads 32, is removed using an anisotropic etch process, such as reactive ion etch. The dielectric liner 41 typically has a thickness measured from the sidewall of the via 40, 45 ranging from 1 nm to 20 nm, which in some embodiments may range from 5 nm to 10 nm.

FIG. 6 depicts filling the contact pad via 40 and the through first chip via 45 with a conductive material 42 to provide interconnects 50 into the first chip 10. In one embodiment, the contact pad via 40 is filled with a conductive material 42, in which the conductive material is in direct physical contact with the contact pads 32, and provides electrical communication to at least one of the second devices on the second chip 30. In one embodiment, the through first chip via 45 is filled with a conductive material 42 to provide electrical communication to an adjacent chip that is stacked on the first chip 10 having a second chip 30 that is embedded therein. The through first chip via 45 may also be filled with a conductive material 42 to provide electrical communication to the first electrical devices that are present in the first chip 10. In one embodiment, the conductive material 42 is provided by a metal that may include, but is not limited to tungsten, copper, aluminum, silver, gold, and alloys thereof. The conductive material 42 may be deposited within the vias 40, 45 using chemical vapor deposition (CVD), sputtering or plating. In some embodiments, following filling the vias 40, 45 with the conductive material 42, any of the conductive material 42 that extends to the exterior of the vias 40, 45 may be removed using a planarization process, such as chemical mechanical planarization (CMP).

FIG. 6 also depicts forming interconnect contact pads 55 in direct contact with the interconnects 50. The interconnect contact pads 55 typically have a width that is greater than the interconnects 50. In one embodiment, forming the interconnect contact pads 55 includes etching the first protective layer 12 to provide an enlarged opening overlying the interconnect 50, filling the enlarged opening with a conductive material, and planarizing to remove any excess conducive material that extends to the exterior of the enlarged opening. The interconnect contact pads 55 may be composed of a metal that includes, but is not limited to tungsten, copper, aluminum, silver, gold, and alloys thereof. The interconnect contact pads 55 may be formed using chemical vapor deposition (CVD), sputtering or plating.

The structure depicted in FIG. 6 is a chip-in-chip integration structure 100 having a second chip 30, i.e., child chip, which is embedded and in some embodiments encapsulated within a first chip 10, i.e., parent chip. The chip-in-chip integration structure 100 includes a first chip 10 including first electrical devices, in which the first chip 10 includes a recess present therein, a second chip 30 including second electrical devices, in which the second chip 30 is positioned within the recess of the first chip 10; and interconnects 50 to at least one of the second electrical devices of the second chip 30 that are present through the first chip 10 into contact with the second chip 30.

Figure 7:
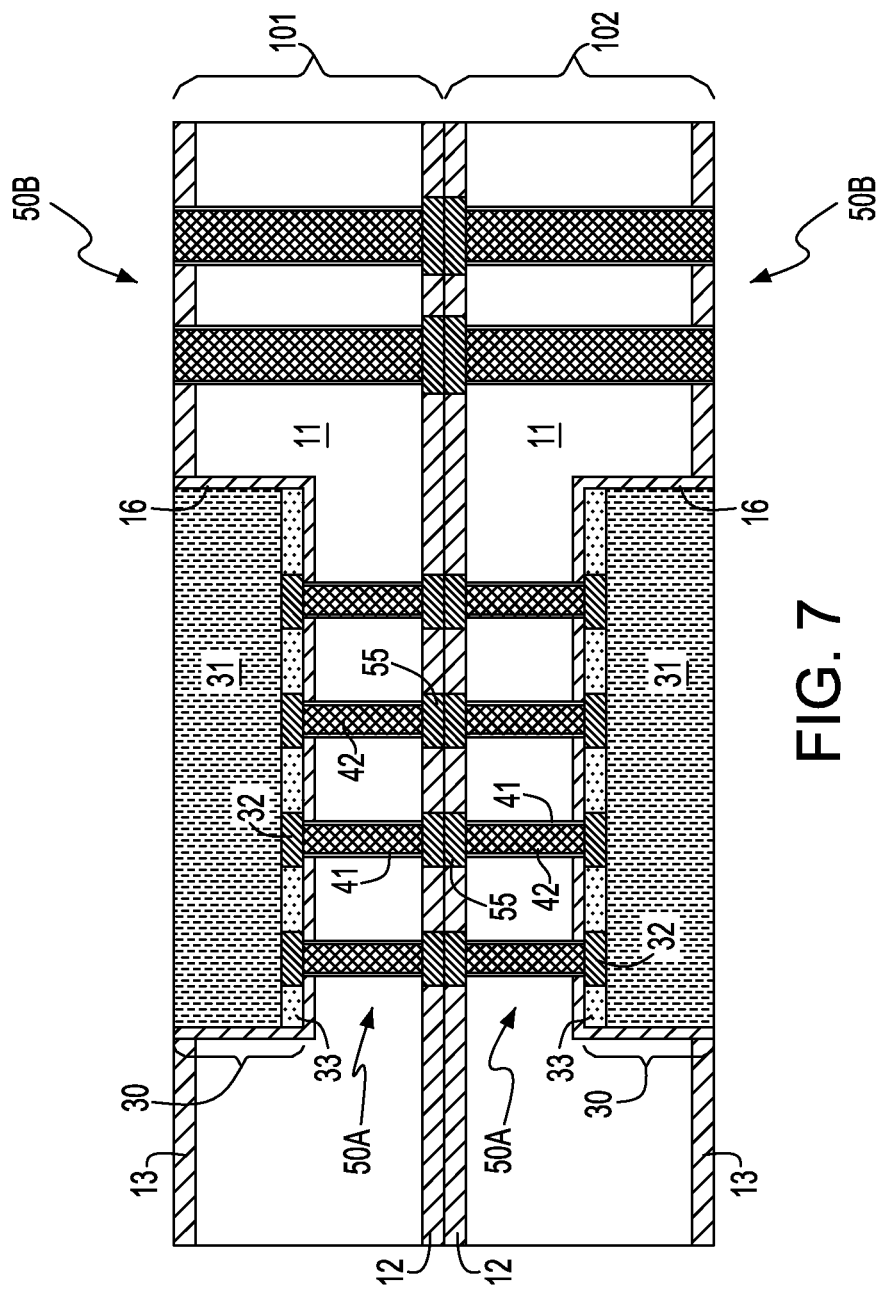
FIG. 7 is a side cross-sectional view of a multi-layered electronic device including two levels each including a second chip that is present embedded within a first chip in a chip-in-chip integration structure, in accordance with one embodiment of the present invention.
Figure 8:
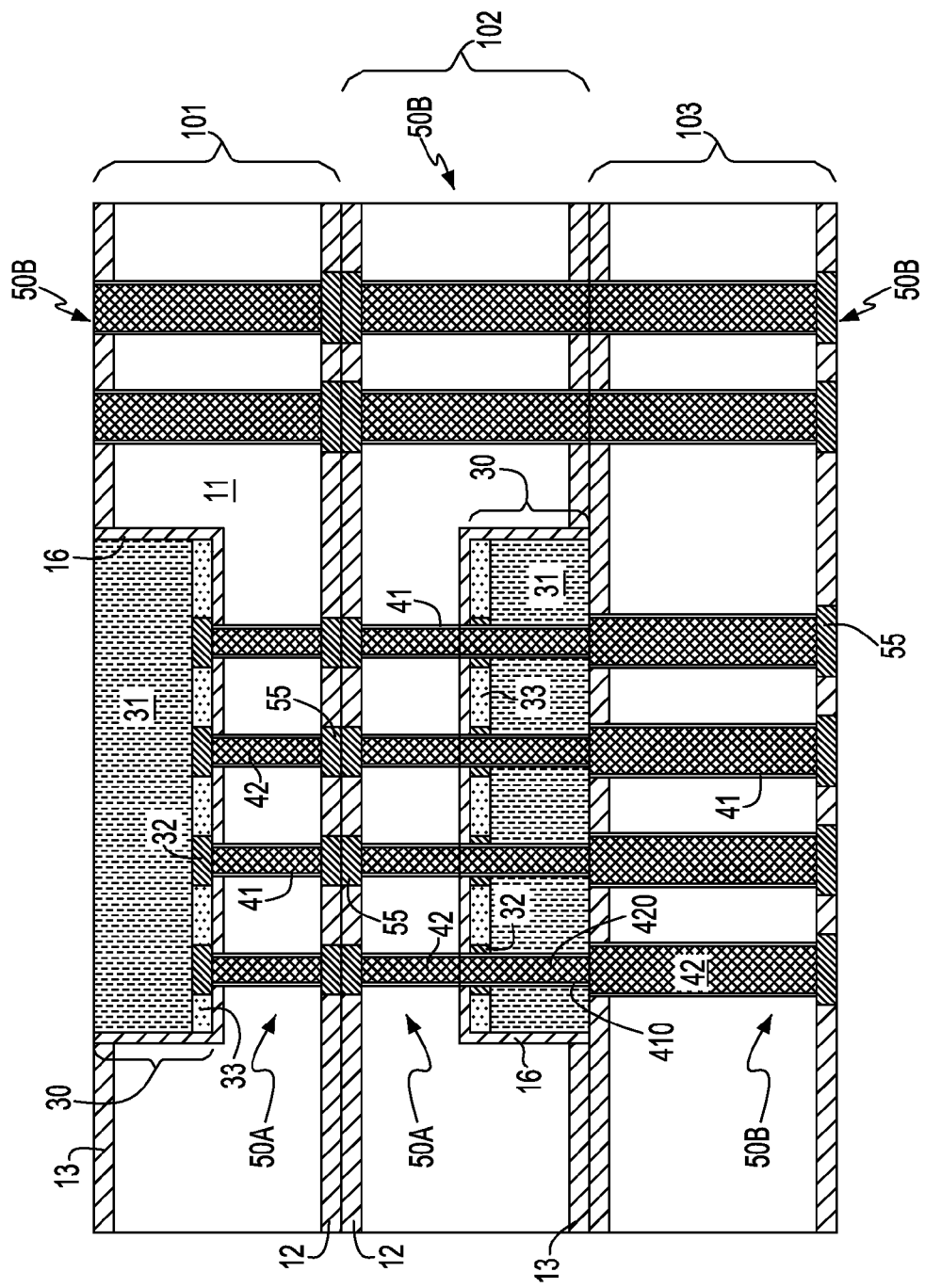
FIG. 8 is a side cross-sectional view of a multi-layered electronic device including two levels each including a second chip that is present embedded within a first chip, and a third level that does not include an embedded chip, in accordance with one embodiment of the present invention.

FIG. 7 depicts one embodiment of stacking two chip-in-chip integration structures, in accordance with the present disclosure. More specifically, a first chip-in-chip integration structure 101 is present overlying a second chip-in-chip integration structure 102, in which a front face of the first chip-in-chip integration structure 101 is in direct contact with a front face of the second chip-in-chip integration structure 102. More specifically, the first protective layer 12 of the first chip-in-chip integration structure 101 is in direct contact with the first protective layer 12 of the second chip-in-chip integration structure 102. It is observed that the first and second chip-in-chip integration structures 101, 102 each are structurally similar to the chip-in-chip integration structure 100 that is depicted in FIG. 6. In one embodiment, a first group of interconnects 50A is used to provide electrical communication to the second chip 30 and a second group of interconnects 50B is used to provide electrical communication for chip stacking FIG. 8 depicts another example of chip stacking wherein the first chip-in chip integration structure 101 and the second chip-in-chip integration structure 102 that are depicted in FIG. 7 is further bonded to third chip 103. In one embodiment, the third chip 103 is a single chip that does not include a second chip embedded therein. In one example, an extension 410, 420 that is present through the second chip 30 of the second chip-in-chip 102 integration, and provides for electrical communication between the interconnects 50A of the first and second chip-in-chip integration structures 101, 102 and the interconnects 50B of the third chip integration structure 103.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method of forming a device comprising:
forming a recess in a first chip, the recess extending from a second chip surface of the first chip into the first chip, wherein the first chip includes first electrical devices;
positioning a second chip within the recess of the first chip, wherein the second chip includes second electrical devices and contact pads electrically connected to the second electrical devices, the contact pads contacting a base of the recess;
forming vias in the first chip after the second chip has been positioned within the recess, the vias comprising first vias extending from a first chip surface of the first chip that is opposite the second chip surface into a portion of the first chip to expose the contact pads of the second chip and second vias extending through an entire thickness of the first chip; and
simultaneously forming first interconnects within the first vias and second interconnects within second vias, wherein the first interconnects are in direct contact with the contact pads of the second chip.

2. The method of claim 1, wherein the first chip comprises a first body having a first protective layer on a first surface of the body and a second protective layer on a second surface of the first body, in which the first surface is opposite the second surface.

3. The method of claim 2, wherein the first electrical devices include at least one of semiconductors devices, memory devices, resistors and capacitors, wherein the first electrical devices are present within or on the first body.

4. The method of claim 2, wherein the forming of the recess in the first chip comprises forming an first etch mask on the second protective layer, etching the second protective layer, etching the first body to provide the recess; and forming a conformal dielectric layer on sidewalls and the base of the recess.

5. The method of claim 4, wherein the etching of the second protective layer and the etching of the first body comprises an anisotropic etch process.

6. The method of claim 4, wherein the second chip further comprises a second body and an interlevel dielectric layer present on a first surface of the second body, said contact pads extending through the interlevel dielectric layer into contact with the first surface of the second body.

7. The method of claim 6, wherein the second chip includes second electrical devices selected from the group consisting of semiconductors devices, memory devices, resistors and capacitors, wherein the second electrical devices are present within or on the second body.

8. The method of claim 6, wherein the positioning of the second chip within the recess of the first chip comprises contacting the contact pads of the second chip with the conformal dielectric layer on the base of the recess.

9. The method of claim 8, wherein a second surface of the second body of the second chip that is opposite the first surface of the second chip is coplanar with the second chip surface of the first chip.

10. The method of claim 9, wherein the forming of the interconnects comprises forming a second etch mask on the first protective layer of the first chip; etching the first protective layer, the first body, and the conformal dielectric layer selective to the contact pads of the second chip to provide the first vias and etching the first protective layer, the first body and the second protective layer to provide the second vias; forming a dielectric liner on sidewalls of the first and the second vias; and filling the first and the second vias with a conductive material to provide the first interconnects within the first vias and the second interconnects within the second vias.

11. The method of claim 10, wherein the conductive material is composed of a metal or doped semiconductor material.

12. The method of claim 10, further comprising forming an interconnect contact pad present on an upper surface of each of the interconnects.

13. The method of claim 12, further comprising removing the second etch mask prior to forming the interconnect contact pad.

14. The method of claim 1, wherein the second chip is encapsulated within the recess of the first chip.

15. The method of claim 1, wherein a depth of the recess is smaller than a thickness of the second chip.

16. The method of claim 1, wherein the second interconnects have a width greater than a width of the first interconnects.

17. The method of claim 1, further comprising stacking at least one another device on the first chip having the second chip embedded therein, wherein the at least one another device is electrically connected to the first chip through said second interconnects.

* * * * *